(12) United States Patent
Liu

(10) Patent No.: US 10,026,608 B2
(45) Date of Patent: Jul. 17, 2018

(54) ARRAY SUBSTRATE, METHOD FOR MANUFACTURING THE SAME, AND DISPLAY DEVICE

(71) Applicant: BOE TECHNOLOGY GROUP CO., LTD., Beijing (CN)

(72) Inventor: Wei Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/533,718

(22) PCT Filed: Jan. 21, 2016

(86) PCT No.: PCT/CN2016/071618
§ 371 (c)(1),
(2) Date: Jun. 7, 2017

(87) PCT Pub. No.: WO2017/031940
PCT Pub. Date: Mar. 2, 2017

(65) Prior Publication Data
US 2017/0352534 A1    Dec. 7, 2017

(30) Foreign Application Priority Data

Aug. 24, 2015    (CN) .......................... 2015 1 0523842

(51) Int. Cl.
*H01L 21/02* (2006.01)
*H01L 21/768* (2006.01)
*H01L 27/12* (2006.01)

(52) U.S. Cl.
CPC .. *H01L 21/02304* (2013.01); *H01L 21/02365* (2013.01); *H01L 21/76841* (2013.01);
(Continued)

(58) Field of Classification Search
CPC ......... H01L 21/02304; H01L 21/02365; H01L 21/76841; H01L 27/1222
See application file for complete search history.

(56) References Cited

U.S. PATENT DOCUMENTS 7,893,440 B2    2/2011    Kwon et al.
9,368,635 B2    6/2016    Dai et al.
(Continued)

FOREIGN PATENT DOCUMENTS

CN    101577283 A    11/2009
CN    102646632 A    8/2012
(Continued)

OTHER PUBLICATIONS

International Search Report of PCT/CN2016/071618 in Chinese, dated Jun. 7, 2016 with English translation.
(Continued)

*Primary Examiner* — Mounir Amer
(74) *Attorney, Agent, or Firm* — Collard & Roe, P.C.

(57) ABSTRACT

A method for manufacturing an array substrate comprises forming a pattern including an active layer, a gate insulating layer and a gate on a base substrate, and forming a pattern including an interlayer dielectric layer, a source, a drain and a pixel electrode through a single patterning process on the base substrate formed with the pattern of the active layer, the gate insulating layer and the gate. An array substrate and a display device are further provided.

12 Claims, 10 Drawing Sheets

(52) U.S. Cl.
CPC ........ *H01L 27/127* (2013.01); *H01L 27/1222* (2013.01); *H01L 27/1288* (2013.01)

(56) References Cited

U.S. PATENT DOCUMENTS

| | | | |
|---|---|---|---|
| 2014/0091280 A1* | 4/2014 | Sun | H01L 33/0041 257/29 |
| 2015/0079732 A1 | 3/2015 | Chae et al. | |
| 2015/0153595 A1* | 6/2015 | Li | G02F 1/0045 349/62 |

FOREIGN PATENT DOCUMENTS

| | | | | |
|---|---|---|---|---|
| CN | 102646717 A | | 8/2012 | |
| CN | 103353689 A | * | 10/2013 | ........... G02F 1/1336 |
| CN | 105097845 A | | 11/2015 | |

OTHER PUBLICATIONS

Notice of Transmittal of the International Search Report of PCT/CN2016/071618 in Chinese, dated Jun. 7, 2016.

Written Opinion of the International Searching Authority of PCT/CN2016/071618 in Chinese, dated Jun. 7, 2016 with English translation.

Chinese Office Action in Chinese Application No. 201510523842.X, dated Aug. 2, 2017 with English translation.

\* cited by examiner

ARRAY SUBSTRATE, METHOD FOR MANUFACTURING THE SAME, AND DISPLAY DEVICE

CROSS REFERENCE TO RELATED APPLICATIONS

This application is the National Stage of PCT/CN2016/071618 filed on Jan. 21, 2016, which claims priority under 35 U.S.C. § 119 of Chinese Application No. 201510523842.X filed on Aug. 24, 2015, the disclosure of which is incorporated by reference.

TECHNICAL FIELD

Embodiments of the present disclosure relate to an array substrate and a method for manufacturing the same, and a display device.

BACKGROUND

With a continuous development of display technology, great progresses are made in flat panel displays such as Light Emitting Diode (LED), Organic Light Emitting Diode (OLED), Plasma Display Panel (PDP), Liquid Crystal Display (LCD) and the like.

A typical OLED array substrate is taken as an example. It comprises a base substrate, and a Thin Film Transistor (TFT) and an organic electroluminescent device disposed on the base substrate. The TFT includes a gate, an active layer, a source and a drain, and the organic electroluminescent device includes a pixel electrode, a light emitting layer, and a cathode. The TFT is generally classified into a top gate type and a bottom gate type. Next, manufacturing processes for the TFT will be described by taking an array substrate having a top gate type TFT as an example. As shown in FIG. 1a to FIG. 1i, the manufacturing processes for the TFT comprise the following steps: firstly, forming a buffer layer 101 on a base substrate 100 as shown in FIG. 1a; then, forming a pattern of an active layer 102 on the buffer layer 101 as shown in FIG. 1b; next, sequentially depositing a gate insulating layer film and a gate film on the pattern of the active layer 102, and forming a pattern of a gate insulating layer 103 and a gate 104 through a patterning process, as shown in FIG. 1c; then, depositing an interlayer dielectric layer film, forming a via passing through the interlayer dielectric layer film through a patterning process to obtain a pattern of the interlayer dielectric layer 105, as shown in FIG. 1d; next, forming a pattern of a source 106 and a drain 107, the source 106 and the drain 107 being electrically connected with the active layer 102 respectively through the via passing through the interlayer dielectric layer film, as shown in FIG. 1e; then, depositing a passivation layer film and forming a via passing through the passivation layer film through a patterning process to obtain a pattern of a passivation layer 108, as shown in FIG. 1f; next, forming a pattern of a pixel electrode 109, the pixel electrode 109 being electrically connected with the drain 107 through the via passing through the passivation layer film, as shown in FIG. 1g; then, forming a pattern of a pixel defining layer 110 as shown in FIG. 1h; finally, forming a light emitting layer 111 and a cathode 112 as shown in FIG. 1i.

In the above-described manufacturing processes for the OLED array substrate, masking shall be performed seven times in total and thus the manufacturing processes are rather complicated.

SUMMARY

At least one embodiment of the present disclosure provides an array substrate, a method for manufacturing the same, and a display device, so as to simplify manufacturing processes for the array substrate.

At least one embodiment of the present disclosure provides a method for manufacturing an array substrate, comprising forming patterns of an active layer, a gate insulating layer and a gate, and further comprising:

forming a pattern of an interlayer dielectric layer, a source, a drain and a pixel electrode through a single patterning process.

In one embodiment of the present disclosure, forming a pattern of an interlayer dielectric layer, a source, a drain and a pixel electrode through a single patterning process comprises:

forming a an interlayer dielectric layer film;

coating a first photoresist on the interlayer dielectric layer film;

performing an exposure treatment on the first photoresist by use of a first mask plate of halftone or gray tones, so that the first photoresist forms a completely-removed region of the first photoresist, a completely-maintained region of the first photoresist and a half-maintained region of the first photoresist; wherein the completely-removed region of the first photoresist corresponds to a region corresponding to a via to be formed passing through the interlayer dielectric layer film, the half-maintained region of the first photoresist corresponds to a region other than the via in the pattern of the source, the drain and the pixel electrode to be formed, and the completely-maintained region of the first photoresist corresponds to a region other than the pattern of the source, the drain and the pixel electrode;

performing a developing treatment on the first photoresist which has been subjected to the exposure treatment, so that a thickness of the first photoresist in the completely-maintained region of the first photoresist is unchanged, the first photoresist in the completely-removed region of the first photoresist is completely removed, and a thickness of the first photoresist in the half-maintained region of the first photoresist is decreased;

completely etching the interlayer dielectric layer film in the completely-removed region of the first photoresist by an etching process, and forming the via passing through the interlayer dielectric layer film;

removing the first photoresist in the half-maintained region of the first photoresist by an ashing process and exposing the interlayer dielectric layer film in the half-maintained region of the first photoresist;

forming a metallic layer film on the first photoresist which has been subjected to the ashing process; and peeling off the remaining first photoresist and forming a pattern comprising an interlayer dielectric layer, a source, a drain and a pixel electrode.

In one embodiment of the present disclosure, the half-maintained region of the first photoresist further corresponds to a region of a pattern of signal lines to be formed and electrically connected with the source;

forming a pattern comprising an interlayer dielectric layer, a source, a drain and a pixel electrode further comprises forming a pattern comprising the signal lines electrically connected with the source at the same time.

In one embodiment of the present disclosure, forming a metallic layer film comprises depositing a composite conductive film of aluminum neodymium alloy and indium tin oxide through magnetron sputtering.

In one embodiment of the present disclosure, forming a pattern comprising an active layer, a gate insulating layer and a gate on a base substrate comprises:

forming the pattern comprising the active layer, the gate insulating layer and the gate on the base substrate through a single patterning process.

In one embodiment of the present disclosure, forming the pattern comprising the active layer, the gate insulating layer and the gate on the base substrate through a single patterning process comprises:

sequentially forming an active layer film, a gate insulating layer film and a gate film on the base substrate;

coating a second photoresist on the gate film;

performing an exposure treatment on the second photoresist by use of a second mask plate of halftone or gray tones, so that the second photoresist forms a completely-removed region of the second photoresist, a completely-maintained region of the second photoresist and a half-maintained region of the second photoresist; wherein the completely-maintained region of the second photoresist corresponds to a region corresponding to a pattern of the gate and gate insulating layer to be formed, the half-maintained region of the second photoresist corresponds to a region in a pattern of the active layer other than the pattern of the gate and gate insulating layer to be formed, the second photoresist completely-removed region corresponds to a region other than the pattern of the active layer;

performing a developing treatment on the second photoresist which has been subjected to the exposure treatment, so that a thickness of the second photoresist in the completely-maintained region of the second photoresist is unchanged, the second photoresist in the completely-removed region of the second photoresist is completely removed, and a thickness of the second photoresist in the half-maintained region of the second photoresist is decreased;

completely etching the gate film, the gate insulating layer film and the active layer film in the completely-removed region of the second photoresist by a first etching process;

removing the second photoresist in the half-maintained region of the second photoresist by an ashing process and exposing the gate film in the second photoresist half-maintained region;

completely etching the gate film and the gate insulating layer film in the second photoresist half-maintained region by a second etching process; and peeling off the remaining second photoresist and forming the pattern comprising the active layer, the gate insulating layer and the gate.

In one embodiment of the present disclosure, the completely-maintained region of the second photoresist further corresponds to a region of a pattern of signal lines to be formed and electrically connected with the gate;

forming the pattern comprising the active layer, the gate insulating layer and the gate further comprises forming the pattern comprising the signal lines electrically connected with the gate at the same time.

At least one embodiment of the present disclosure provides an array substrate manufactured by the method of the present disclosure as mentioned above.

In one embodiment of the present disclosure, the array substrate further comprises an organic electroluminescent device disposed on the array substrate.

At least one embodiment of the present disclosure provides a display device, comprising the array substrate of the present disclosure as mentioned above.

In the array substrate, the method for manufacturing the array substrate and the display device according to the embodiments of the present disclosure, especially in the method for manufacturing the array substrate, the pattern of the interlayer dielectric layer, the source, the drain and the pixel electrode is formed through a single patterning process, thus, compared with the conventional method for manufacturing array substrate in which a passivation layer is disposed between the film layer where the source and drain are disposed and the film layer where the pixel electrode is disposed and masking is required to be performed for four times in total so as to form a pattern of the interlayer dielectric layer, the source, the drain, the passivation layer and the pixel electrode, the number of masking performed can be reduced and the manufacturing process for the array substrate can be simplified.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

Figure 1A:
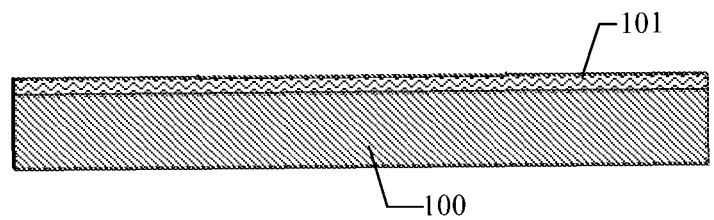
FIG. 1a to FIG. 1i are illustrative views of structures obtained by respective manufacturing steps of the conventional manufacturing method for an OLED array substrate.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Shapes and thicknesses of various film layers in the drawings are merely illustrative and are intended to describe the present disclosure and are not drawn in accordance with an actual proportion of the array substrate.

Figure 2:
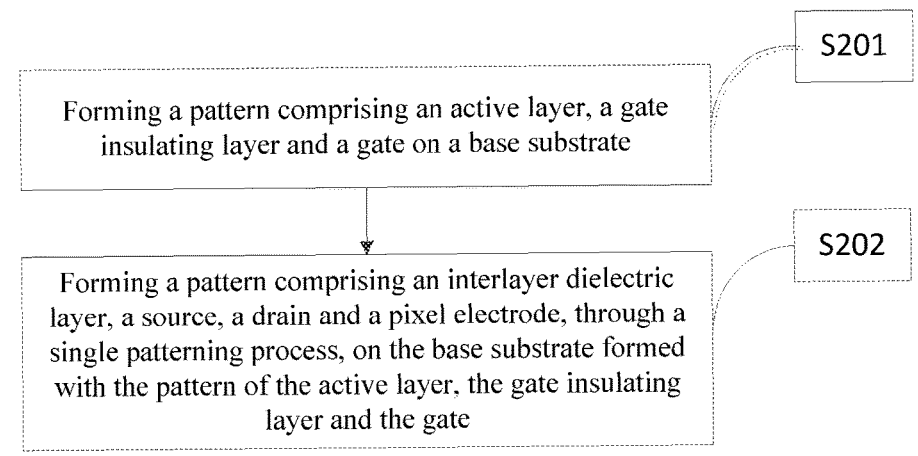
FIG. 2 is a flow chart of a method for manufacturing the array substrate according to one embodiment of the present disclosure.

One embodiment of the present disclosure provides a method for manufacturing an array substrate. As illustrated in FIG. 2, the method comprises the following steps:

S201 of forming a pattern comprising an active layer, a gate insulating layer and a gate on a base substrate;

S202 of forming a pattern comprising an interlayer dielectric layer, a source, a drain and a pixel electrode, through a single patterning process, on the base substrate formed with the pattern of the active layer, the gate insulating layer and the gate.

In the above method according to the embodiment of the present disclosure, the pattern of the interlayer dielectric layer, the source, the drain and the pixel electrode is formed through a single patterning process. Therefore, compared with the conventional method for manufacturing array substrate in which a passivation layer is disposed between the film layer where the source and drain are disposed and the film layer where the pixel electrode is disposed and masking is required to be performed for four times in total so as to form a pattern of the interlayer dielectric layer, the source, the drain, the passivation layer and the pixel electrode (as shown in FIG. 1d to FIG. 1g), the number of masking performed can be reduced and the manufacturing process for the array substrate can be simplified.

Figure 3:
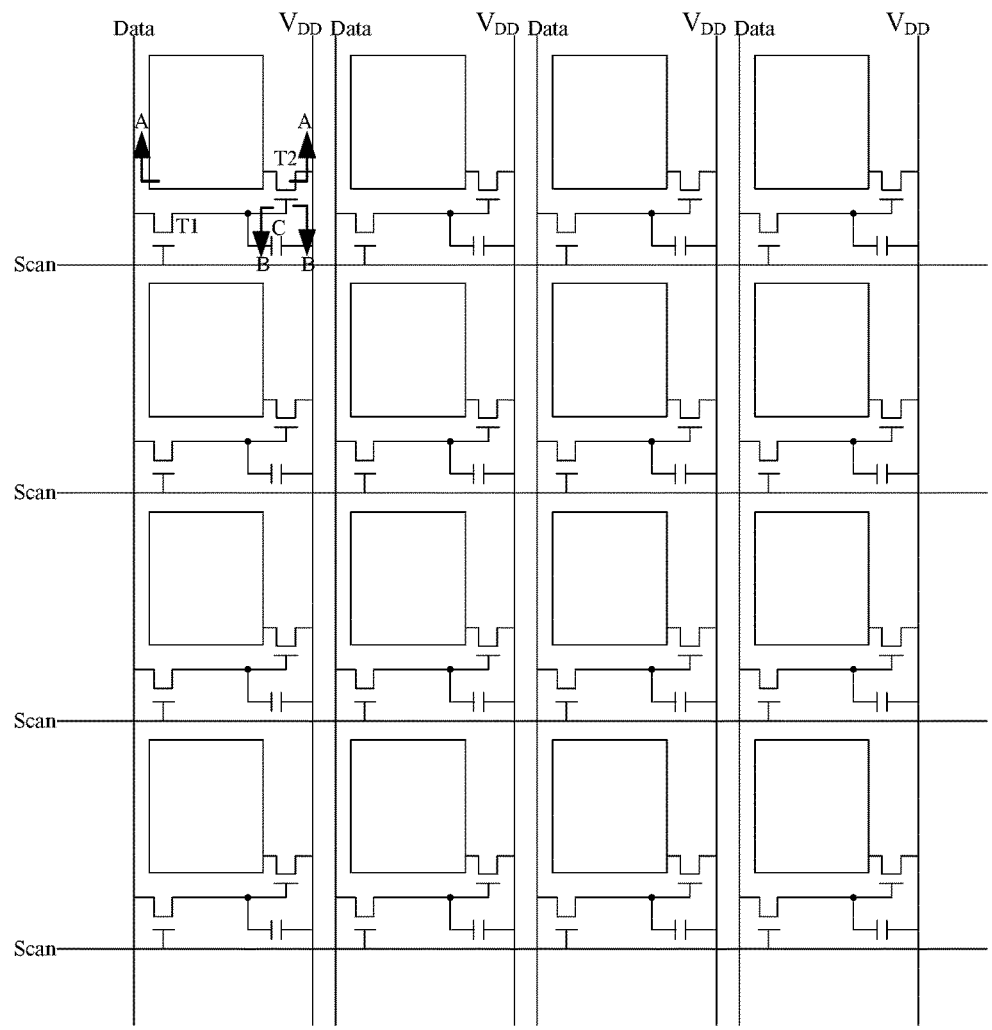
FIG. 3 is an illustrative structural view of an array substrate according to one embodiment of the present disclosure.
Figure 4:
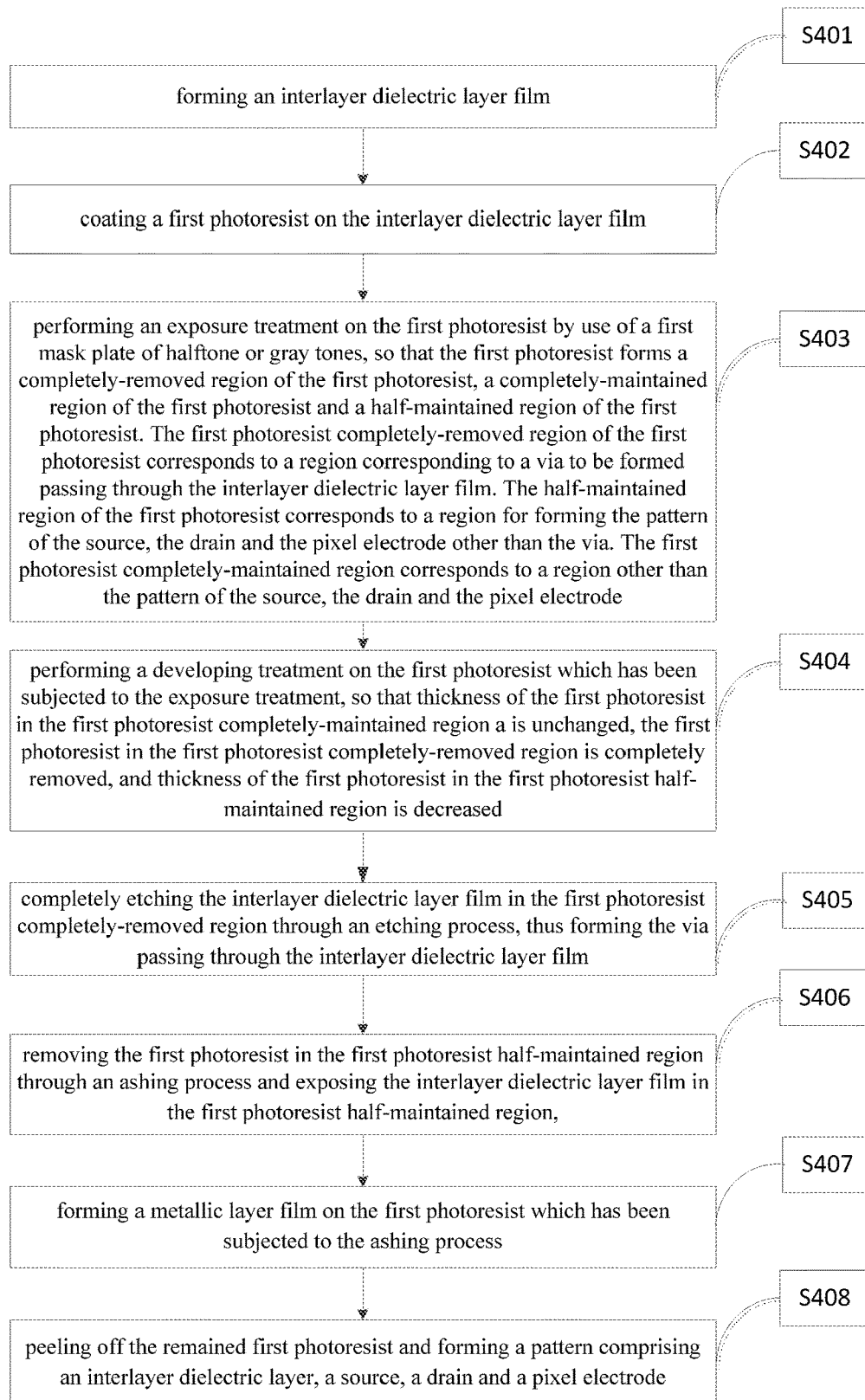
FIG. 4 is a flow chart of a method for manufacturing the array substrate according to another embodiment of the present disclosure.

It is to be noted that the above method according to the embodiment of the present disclosure can be applied to manufacture the OLED array substrate. Alternatively, the above method according to the embodiment of the present disclosure can be applied to manufacture the LCD array substrate. It is not limited herein. The following embodiments will be described by way of example for manufacturing an OLED array substrate having a 2T1C structure as illustrated in FIG. 3 (in such a structure, the OLED is driven by a voltage controlled drive circuit comprising two TFTs and one capacitor).

Figure 5A:
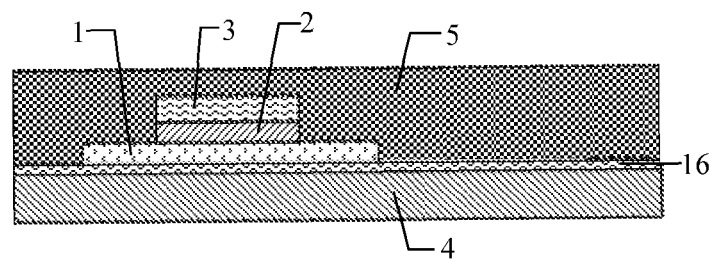
FIG. 5a to FIG. 5g are illustrative structural views of the method for manufacturing the array substrate after a respective step as illustrated in FIG. 4 is performed.
Figure 5B:
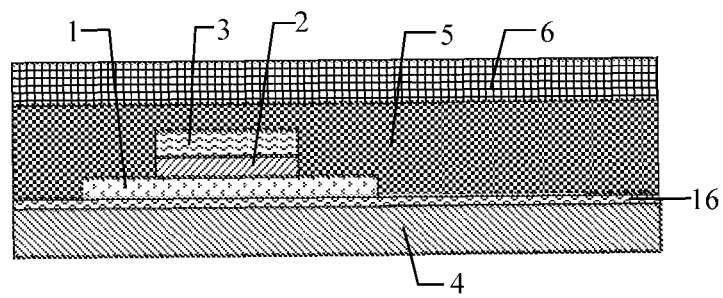
Figure 5C:
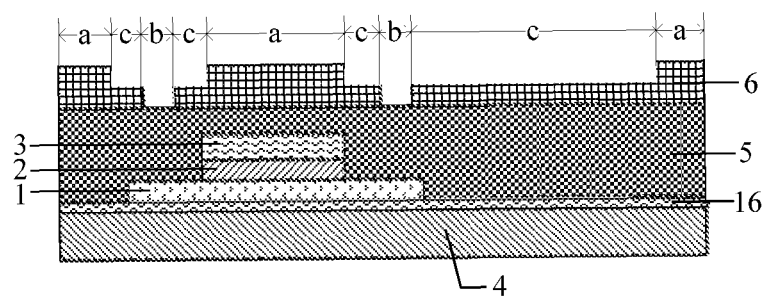
Figure 5D:
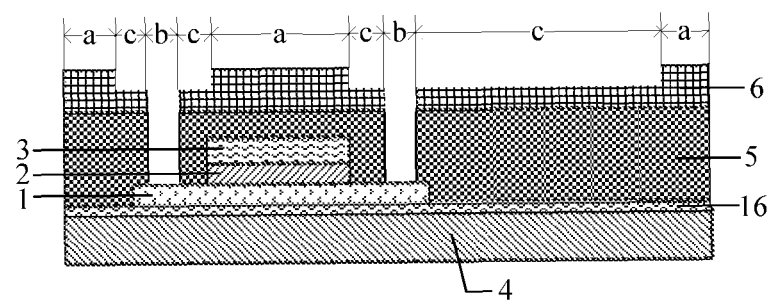
Figure 5E:
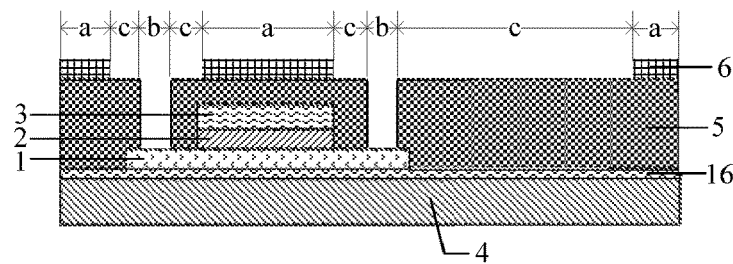
Figure 5F:
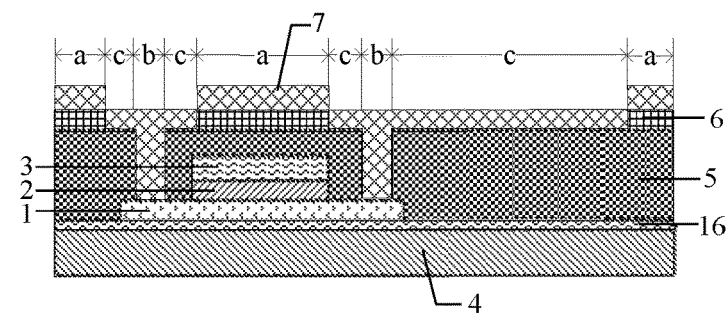
Figure 5G:
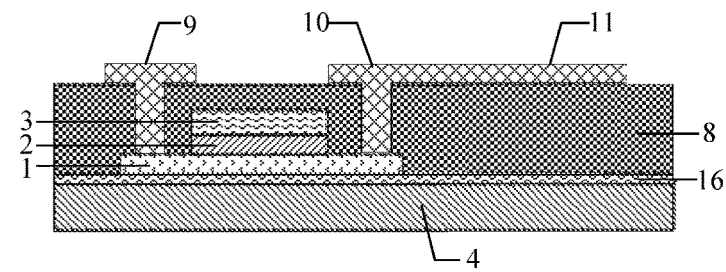

Upon implementation, when implementing the step S202 in the above method according to the embodiment of the present disclosure to form a pattern comprising an interlayer dielectric layer, a source, a drain and a pixel electrode through a single patterning process, as illustrated in FIG. 4 and FIG. 5a to FIG. 5g (FIG. 5g is a cross-section view taken along the AA direction of FIG. 3), it can comprise following steps:

S401 of forming an interlayer dielectric layer film;

Description is made by taking a top gate type TFT an example. As illustrated in FIG. 5a, an interlayer dielectric layer film 5 is formed on the base substrate 4 formed with a pattern of the active layer 1, the gate insulating layer 2 and the gate 3 which are sequentially laminated. For example, the interlayer dielectric layer film 5 is formed of silicon oxide (SiOx) material. In one embodiment of the present disclosure, to enhance the adhesion between the pattern of the active layer 1 and the base substrate 4, as illustrated in FIG. 5a, a buffer layer 16 can be disposed between the pattern of the active layer 1 and the base substrate 4. Material of the buffer layer 16 is typically silicon oxide (SiOx) or silicon nitride (SiNx) and etc. The buffer layer 16 typically has a thickness in a range of 100 nm to 500 nm.

S402 of coating a first photoresist 6 on the interlayer dielectric layer film 5, as illustrated in FIG. 5b;

S403 of performing an exposure treatment on the first photoresist by use of a first mask plate of halftone or gray tones, so that the first photoresist forms a completely-removed region of the first photoresist, a completely-maintained region of the first photoresist and a half-maintained region of the first photoresist. The first photoresist completely-removed region of the first photoresist b corresponds to a region corresponding to a via to be formed passing through the interlayer dielectric layer film. The half-maintained region of the first photoresist c corresponds to a region for forming the pattern of the source, the drain and the pixel electrode other than the via. The first photoresist completely-maintained region a corresponds to a region other than the pattern of the source, the drain and the pixel electrode.

S404 of performing a developing treatment on the first photoresist 6 which has been subjected to the exposure treatment, so that thickness of the first photoresist 6 in the first photoresist completely-maintained region a is unchanged, the first photoresist 6 in the first photoresist completely-removed region b is completely removed, and thickness of the first photoresist 6 in the first photoresist half-maintained region c is decreased, as illustrated in FIG. 5c.

S405 of completely etching the interlayer dielectric layer film 5 in the first photoresist completely-removed region b through an etching process, thus forming the via passing through the interlayer dielectric layer film 5, as illustrated in FIG. 5d. For example, the interlayer dielectric layer film 5 in the first photoresist completely-removed region b can be subjected to a dry etching process.

S406 of removing the first photoresist 6 in the first photoresist half-maintained region c through an ashing process and exposing the interlayer dielectric layer film 5 in the first photoresist half-maintained region c, as illustrated in FIG. 5e.

S407 of forming a metallic layer film 7 on the first photoresist 6 which has been subjected to the ashing process, as illustrated in FIG. 5f.

S408 of peeling off the remained first photoresist 6 and forming a pattern comprising an interlayer dielectric layer 8, a source 9, a drain 10 and a pixel electrode 11, as illustrated in FIG. 5g. The pattern of the source 9 and the drain 10 is electrically connected with the pattern of the active layer 1 through the via in the pattern of the interlayer dielectric layer 8.

Figure 5H:
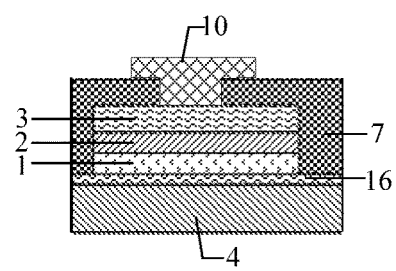
FIG. 5h is a cross-section view taken along BB direction in FIG. 3.
Figure 6:
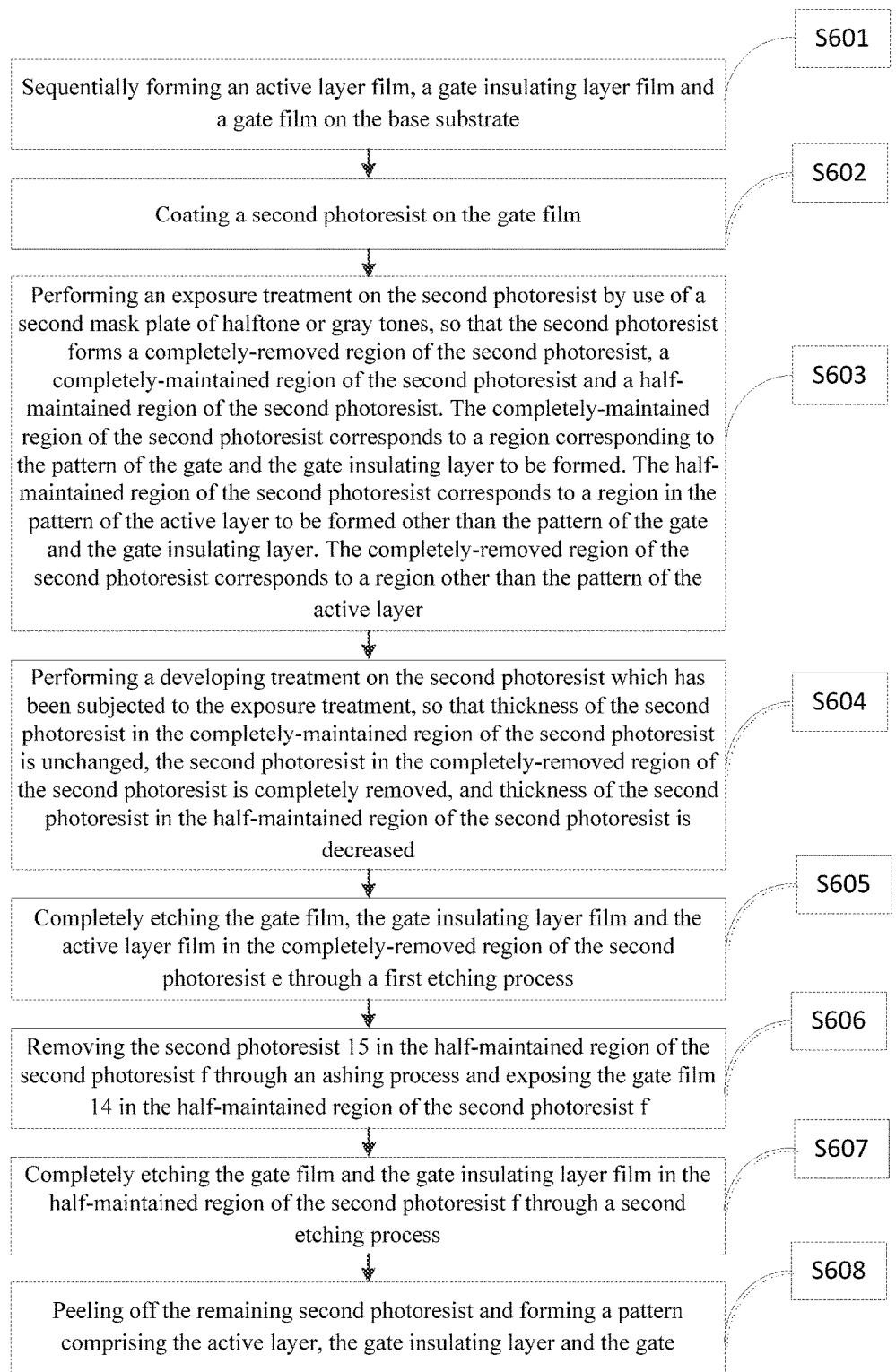
FIG. 6 is a flow chart of the method for manufacturing the array substrate according to yet another embodiment of the present disclosure.

It is to be noted that when implementing the step S403 of the method provided by the above-described embodiment of the present disclosure to perform an exposure treatment on the first photoresist by use of a first mask plate of halftone or gray tones so that the first photoresist forms a completely-removed region of the first photoresist, a completely-maintained region of the first photoresist and a half-maintained region of the first photoresist, the via passing through the interlayer dielectric layer film which corresponds to the completely-removed region of the first photoresist not only comprises the via electrically connecting the pattern of the source 9 and the drain 10 with the pattern of the active layer 1 as illustrated in FIG. 5g, but also comprises the via electrically connecting the pattern of the drain 10 of the first thin film transistor (as indicated by T1 in FIG. 3) with the pattern of the gate 3 of the second thin film transistor (as indicated by T2 in FIG. 3) as illustrated in FIG. 5h (a cross-section view taken along the BB direction in FIG. 3).

It is to be noted that, as illustrated in FIG. 5f, the remained first photoresist 6 is the first photoresist 6 in the completely-maintained region of the first photoresist a. When the first photoresist 6 in the completely-maintained region of the first photoresist a is peeled off, the metallic layer film 7 above the first photoresist 6 in the completely-maintained region of the first photoresist a is peeled off along with the first photoresist 6 at the same time, while the metallic layer film 7 is remained in the completely-removed region of the first photoresist b and the half-maintained region of the first photoresist c, thereby forming the pattern of the source 9, the drain 10 and the pixel electrode 11.

In one embodiment of the present disclosure, to further simplify the manufacturing processes for the array substrate, signal lines (for example, the data line Data and the level signal line $V_{DD}$ as illustrated in FIG. 3) electrically connected with the source and the pattern of the source can be formed simultaneously. Based on this, in the method provided by the above-described embodiment of the present disclosure, the half-maintained region of the first photoresist can further correspond to the region of the pattern of the signal lines electrically connected with the source which is to be formed. When implementing the step S102 in the method provided by the above-described embodiment of the present disclosure to form the pattern comprising the interlayer dielectric layer, the source, the drain and the pixel electrode, a pattern of the signal lines electrically connected with the source can be further formed.

Upon implementation, when performing the step S407 in the method provided by the above-described embodiment of the present disclosure to form the metallic layer film, for example, magnetron sputtering method can be used to deposit a composite conductive film of aluminum neodymium alloy and indium tin oxide (AlNd/ITO) for the reason that AlNd/ITO is the metal commonly used for the source, the drain and the pixel electrode. AlNd/ITO has a reflective function, and the manufactured OLED has a top-emitting type structure (i.e., the light is emitted from the side of the OLED cover plate side) and is very suitable for manufacturing a high-resolution OLED. Of course, the material of the source, the drain and the pixel electrode is not limited to AlNd/ITO, but can be other material commonly used for the source, the drain and the pixel electrode, which is not restricted here.

Figure 1B:
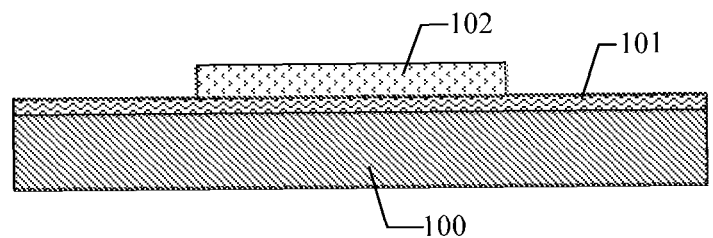
Figure 1C:
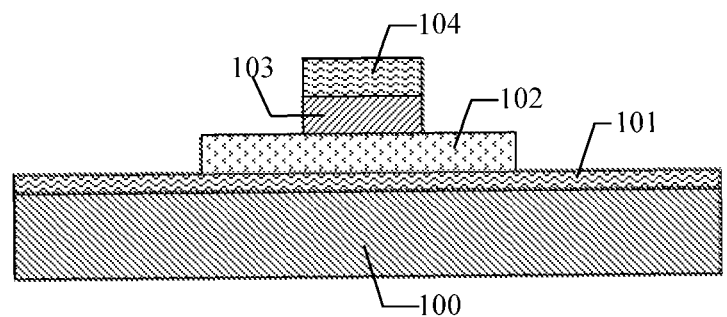
Figure 1D:
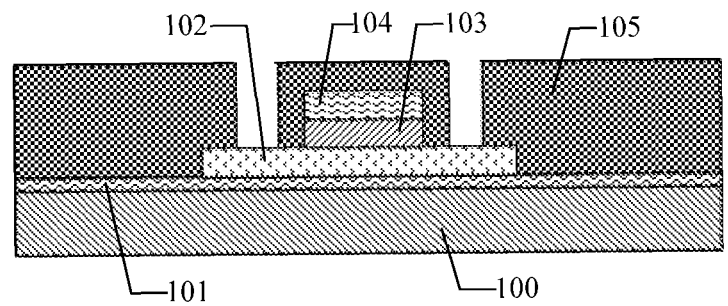
Figure 1E:
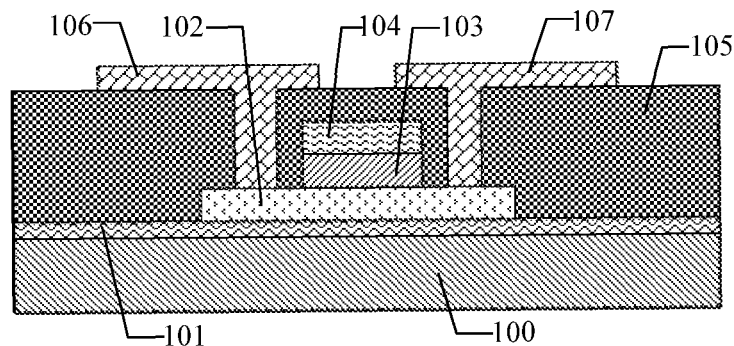
Figure 1F:
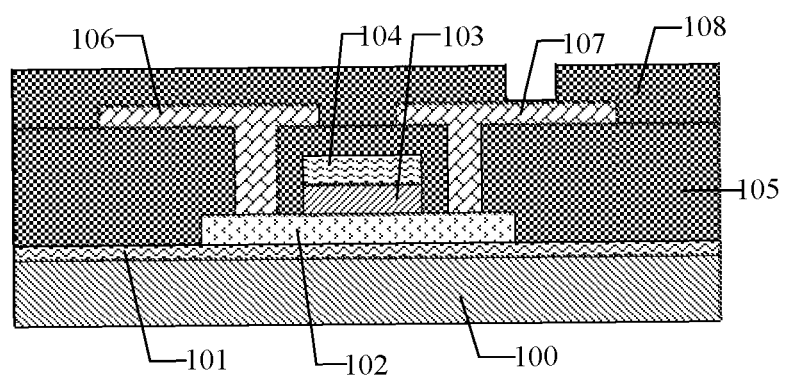
Figure 1G:
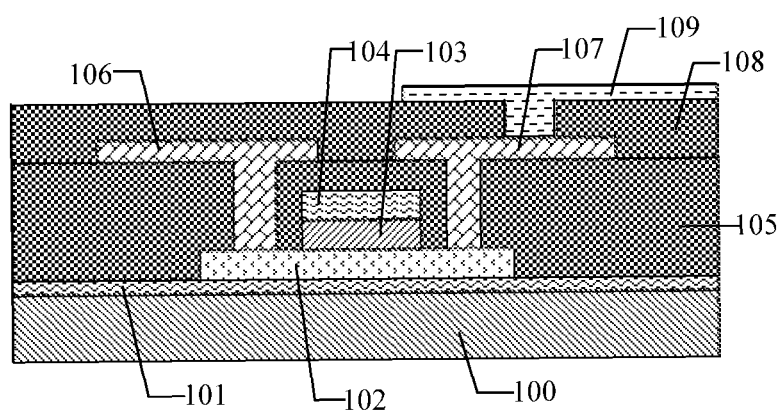

Upon implementation, when performing the step S101 in the method provided by the above-described embodiment of the present disclosure to form the pattern comprising the active layer, the gate insulating layer and the gate on the base substrate, the pattern can be formed by the conventional two masking processes as illustrated in FIG. 1b and FIG. 1c. For example, to further simplify the manufacturing processes for the array substrate, when performing the step S101 in the method provided by the above-described embodiment of the present disclosure to form the pattern comprising the active layer, the gate insulating layer and the gate on the base substrate, the pattern comprising the active layer, the gate insulating layer and the gate can be formed through a single pattering process.

Figure 7A:
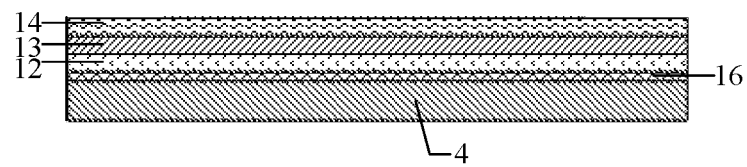
FIG. 7a to FIG. 7g are illustrative structural views of the method for manufacturing the array substrate after a respective step as illustrated in FIG. 6 is performed.

Upon implementation, in the method provided by the above-described embodiment of the present disclosure, as illustrated in FIG. 6 and FIG. 7a to FIG. 7g, forming the pattern comprising the active layer, the gate insulating layer and the gate through a single patterning process, for example, can comprise the following steps:

S601 of sequentially forming an active layer film 12, a gate insulating layer film 13 and a gate film 14 on the base substrate 4, as illustrated in FIG. 7a. For example, transparent conductive oxide material such as Indium Gallium Zinc Oxides (IGZO) and the like can be used to form the active layer film 12. Thickness of the active layer film 12 is typically controlled to be in a range of 40 nm to 100 nm. Silicon oxide (SiOx) material can be used to form the gate insulating layer film 13. Thickness of the gate insulating layer film 13 is typically controlled to be in a range of 150 nm to 300 nm. For example, to enhance the adhesion between the active layer film 12 and the base substrate 4, as illustrated in FIG. 7a, a buffer layer 16 can be formed before the active layer film 12 is formed.

Figure 7B:
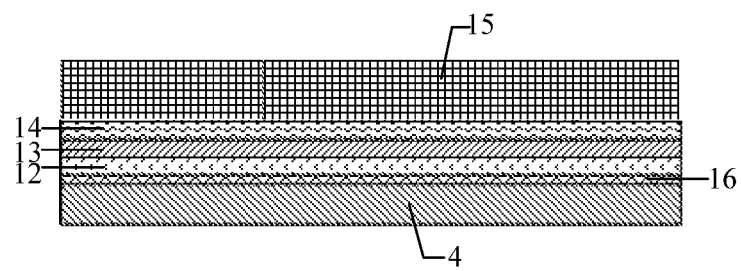

S602 of coating a second photoresist 15 on the gate film 14, as illustrated in FIG. 7b;

S603 of performing an exposure treatment on the second photoresist by use of a second mask plate of halftone or gray tones, so that the second photoresist forms a completely-removed region of the second photoresist, a completely-maintained region of the second photoresist and a half-maintained region of the second photoresist. The completely-maintained region of the second photoresist corresponds to a region corresponding to the pattern of the gate and the gate insulating layer to be formed. The half-maintained region of the second photoresist corresponds to a region in the pattern of the active layer to be formed other than the pattern of the gate and the gate insulating layer. The completely-removed region of the second photoresist corresponds to a region other than the pattern of the active layer.

Figure 7C:
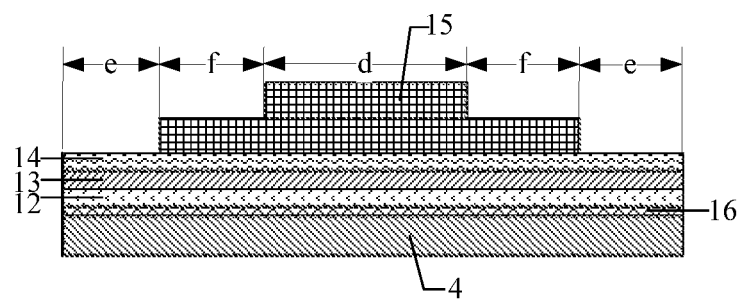
Figure 7D:
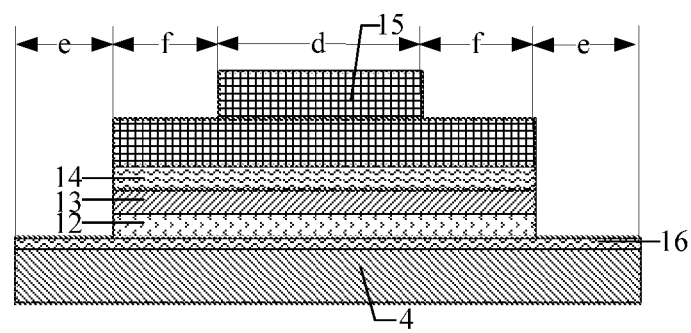

S604 of performing a developing treatment on the second photoresist 15 which has been subjected to the exposure treatment, so that thickness of the second photoresist 15 in the completely-maintained region of the second photoresist d is unchanged, the second photoresist 15 in the completely-removed region of the second photoresist e is completely removed, and thickness of the second photoresist 15 in the half-maintained region of the second photoresist f is decreased, as illustrated in FIG. 7c;

S605 of completely etching the gate film 14, the gate insulating layer film 13 and the active layer film 12 in the completely-removed region of the second photoresist e through a first etching process, as illustrated in FIG. 7d. For example, the gate film 14, the gate insulating layer film 13 and the active layer film 12 in the completely-removed region of the second photoresist e can be firstly subjected to dry etching process and then subjected to wet etching process.

Figure 7E:
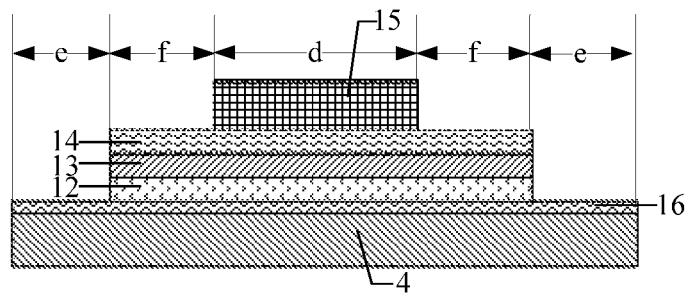

S606 of removing the second photoresist 15 in the half-maintained region of the second photoresist f through an ashing process and exposing the gate film 14 in the half-maintained region of the second photoresist f, as illustrated in FIG. 7e.

Figure 7F:
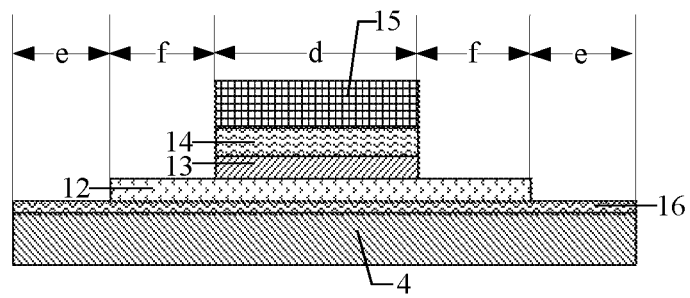

S607 of completely etching the gate film 14 and the gate insulating layer film 13 in the half-maintained region of the second photoresist f through a second etching process, as illustrated in FIG. 7f. For example, the gate film 14 and the gate insulating layer film 13 in the half-maintained region of the second photoresist f can be subjected to a dry etching process.

Figure 7G:
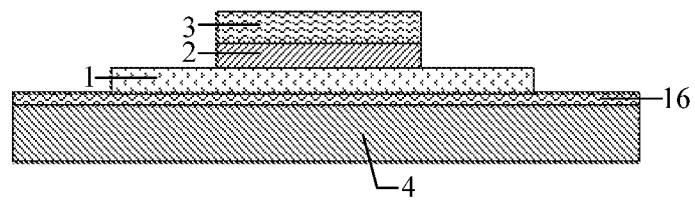

S608 of peeling off the remaining second photoresist 15 and forming a pattern comprising the active layer 1, the gate insulating layer 2 and the gate 3, as illustrated in FIG. 7g.

For example, to further simplify the manufacturing process of the array substrate, the signal line (for example the scanning line Scan as illustrated in FIG. 3) electrically connected with the gate and the pattern of the gate can be simultaneously formed. Based on this, in the method provided by the above-described embodiment of the present disclosure, the completely-maintained region of the second photoresist can further correspond to the region of the pattern of the signal line electrically connected with the gate to be formed. When implementing the step S101 in the method provided by the above-described embodiment of the present disclosure to form the pattern comprising the active layer, the gate insulating layer and the gate, the pattern of the signal line electrically connected with the gate can be also formed simultaneously.

Figure 1H:
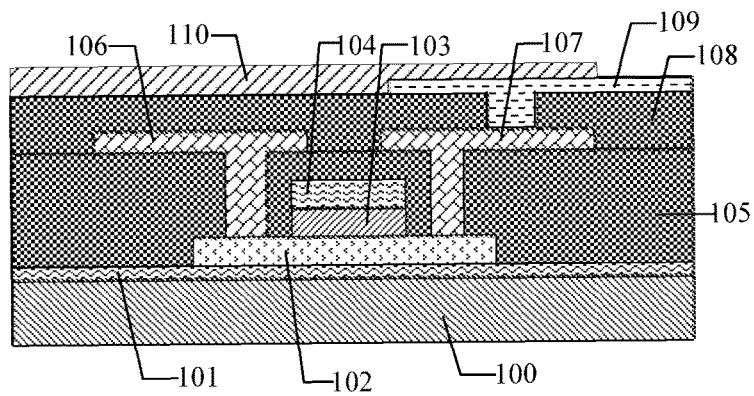
Figure 1I:
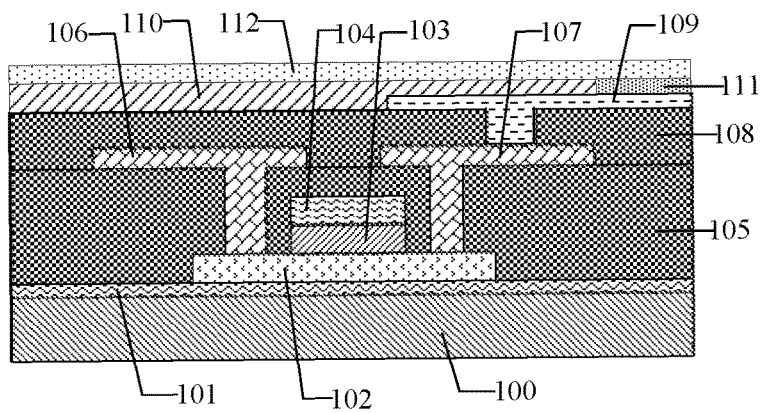

It is to be noted that after the pattern of the pixel electrode is formed, the method provided by the above-described embodiment of the present disclosure can further comprise the following steps: firstly, forming a pattern comprising a pixel defining layer; and then, forming a light emitting layer and a cathode; the above steps are implemented in a similar manner to the implementation of the steps as illustrated in FIG. 1h to FIG. 1i, which will not be described in detail here.

It is clear that in the process of manufacturing the OLED array substrate by the method provided by the above-described embodiment of the present disclosure, only three patterning processes are required (the pattern of the active layer, the gate insulating layer and the gate→the pattern of the interlayer dielectric layer, the source, the drain and the pixel electrode→the pattern of the pixel defining layer), and the manufacturing process of the array substrate can be greatly simplified.

It is to be noted that the above-described embodiments provided by the present disclosure are described by taking the method for manufacturing the OLED array substrate having a 2T1C structure and a top gate type TFT structure. Of course, the method provided by the above-described embodiment of the present disclosure can be applied to manufacture the OLED array substrate having other structures; or alternatively, the method provided by the above-described embodiment of the present disclosure can be also applied to manufacture an LCD array substrate and etc., which is not restricted here. For example, the LCD array substrate can only comprise a data line Data therein.

Based on the same inventive concept, at least one embodiment of the present disclosure further provides an array substrate which is manufactured by the method provided by the above-described embodiment of the present disclosure. With respect to the implementation of the array substrate, the above-described embodiments of the method for manufacturing the array substrate can be referred to, and it is not described in detail here to avoid repetition. Further, the array substrate further comprises an organic electroluminescent device positioned on the array substrate.

Based on the same inventive concept, at least one embodiment of the present disclosure further provides a display device comprising the array substrate provided by the above-described embodiment of the present disclosure. The display device can be any product or component having a display function such as a cell phone, a tablet computer, a television set, a display, a laptop, a digital photo frame, a navigator, or the like. With respect to the implementation of the display device, the above-described embodiments of the array substrate can be referred to, which is not described in detail here to avoid repetition.

In the method for manufacturing the array substrate according to at least one embodiment of the present disclosure, since the pattern of the interlayer dielectric layer, the source, the drain and the pixel electrode is formed through a single patterning process, the number of masking times can be reduced and the manufacturing process of the array substrate can be simplified, compared with the conventional manufacturing processes for array substrate in which a passivation layer needs to be disposed between the film layer where the source and the drain are positioned and the film layer where the pixel electrode is positioned and whose manufacturing process requires masking to be performed four times in total so as to form the pattern of the interlayer dielectric layer, the source, the drain, the passivation layer and the pixel electrode.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201510523842.X filed on Aug. 24, 2015, the disclosure of which is hereby entirely incorporated by reference as a part of the present disclosure.

The invention claimed is:

1. A manufacturing method for manufacturing an array substrate, comprising forming a pattern comprising an active layer, a gate insulating layer and a gate on a base substrate, and further comprising:

forming a pattern comprising an interlayer dielectric layer, a source, a drain and a pixel electrode through a single patterning process on the base substrate formed with the pattern of the active layer, the gate insulating layer and the gate;

wherein forming the pattern comprising the active layer, the gate insulating layer and the gate on the base substrate comprises:

forming the pattern comprising the active layer, the gate insulating layer and the gate on the base substrate through a single patterning process; and wherein forming the pattern comprising the active layer, the gate insulating layer and the gate on the base substrate through the single patterning process comprises:

sequentially forming an active layer film, a gate insulating layer film and a gate film on the base substrate;

coating a second photoresist on the gate film;

performing an exposure treatment on the second photoresist by use of a second mask plate of halftone or gray tones, so that the second photoresist forms a completely-removed region of the second photoresist, a completely-maintained region of the second photoresist and a half-maintained region of the second photoresist; wherein the completely-maintained region of the second photoresist corresponds to a region corresponding to a pattern of the gate and gate insulating layer to be formed, the half-maintained region of the second photoresist corresponds to a region in a pattern of the active layer other than the pattern of the gate and gate insulating layer to be formed, the second photoresist completely-removed region corresponds to a region other than the pattern of the active layer;

performing a developing treatment on the second photoresist which has been subjected to the exposure treatment, so that a thickness of the second photoresist in the completely-maintained region of the second photoresist is unchanged, the second photoresist in the completely-removed region of the second photoresist is completely removed, and a thickness of the second photoresist in the half-maintained region of the second photoresist is decreased;

completely etching the gate film, the gate insulating layer film and the active layer film in the completely-removed region of the second photoresist by a first etching process;

removing the second photoresist in the half-maintained region of the second photoresist by an ashing process and exposing the gate film in the second photoresist half-maintained region;

completely etching the gate film and the gate insulating layer film in the second photoresist half-maintained region by a second etching process; and peeling off the remaining second photoresist and forming the pattern comprising the active layer, the gate insulating layer and the gate.

2. The method as claimed in claim 1, wherein forming the pattern comprising the interlayer dielectric layer, the source, the drain and the pixel electrode through the single patterning process comprises:

forming an interlayer dielectric layer film;

coating a first photoresist on the interlayer dielectric layer film;

performing an exposure treatment on the first photoresist by use of a first mask plate of halftone or gray tones, so that the first photoresist forms a completely-removed region of the first photoresist, a completely-maintained region of the first photoresist and a half-maintained region of the first photoresist; wherein the completely-removed region of the first photoresist corresponds to a region corresponding to a via to be formed passing through the interlayer dielectric layer film, the half-maintained region of the first photoresist corresponds to a region other than the via in the pattern of the source, the drain and the pixel electrode to be formed, and the completely-maintained region of the first photoresist corresponds to a region other than the pattern of the source, the drain and the pixel electrode;

performing a developing treatment on the first photoresist which has been subjected to the exposure treatment, so that a thickness of the first photoresist in the completely-maintained region of the first photoresist is unchanged, the first photoresist in the completely-removed region of the first photoresist is completely removed, and a thickness of the first photoresist in the half-maintained region of the first photoresist is decreased;

completely etching the interlayer dielectric layer film in the completely-removed region of the first photoresist by an etching process, and forming the via passing through the interlayer dielectric layer film;

removing the first photoresist in the half-maintained region of the first photoresist by an ashing process and exposing the interlayer dielectric layer film in the half-maintained region of the first photoresist;

forming a metallic layer film on the first photoresist which has been subjected to the ashing process; and peeling off the remaining first photoresist and forming a pattern comprising an interlayer dielectric layer, a source, a drain and a pixel electrode.

3. The method as claimed in claim 2, wherein the half-maintained region of the first photoresist further corresponds to a region of a pattern of signal lines to be formed and electrically connected with the source;

forming the pattern comprising the interlayer dielectric layer, the source, the drain and the pixel electrode further comprises forming a pattern comprising the signal lines electrically connected with the source at the same time.

4. The method as claimed in claim 3, wherein forming a metallic layer film comprises depositing a composite conductive film of aluminum neodymium alloy and indium tin oxide through magnetron sputtering.

5. An array substrate, manufactured by the method as claimed in claim 3.

6. An array substrate, manufactured by the method as claimed in claim 2.

7. The method as claimed in claim 1, wherein forming a metallic layer film comprises depositing a composite conductive film of aluminum neodymium alloy and indium tin oxide through magnetron sputtering.

8. The method as claimed in claim 1, wherein the completely-maintained region of the second photoresist further corresponds to a region of a pattern of signal lines to be formed and electrically connected with the gate;

forming the pattern comprising the active layer, the gate insulating layer and the gate further comprises forming the pattern comprising the signal lines electrically connected with the gate at the same time.

9. An array substrate, manufactured by the method as claimed in claim 1.

10. The array substrate as claimed in claim 9, further comprising an organic electroluminescent device disposed on the array substrate.

11. A display device, comprising the array substrate as claimed in claim 10.

12. A display device, comprising the array substrate as claimed in claim 9.

* * * * *